United States Patent [19]

Kniepkamp

[11] Patent Number: 4,479,829
[45] Date of Patent: Oct. 30, 1984

[54] METHOD FOR MAKING HIGH RESISTANCE CHROMIUM-FREE SEMICONDUCTOR SUBSTRATE BODY WITH LOW RESISTANCE ACTIVE SEMICONDUCTOR LAYER BY SURFACE IRRADIATION

[75] Inventor: Hermann Kniepkamp, Munich, Fed. Rep. of Germany

[73] Assignee: Siemens Aktiengesellschaft, Berlin & Munich, Fed. Rep. of Germany

[21] Appl. No.: 316,237

[22] Filed: Oct. 29, 1981

[30] Foreign Application Priority Data

Nov. 27, 1980 [DE] Fed. Rep. of Germany ....... 3044723

[51] Int. Cl.³ ................. H01L 21/268; H01L 21/263; H01L 21/26; H01L 21/324
[52] U.S. Cl. .................................. 148/1.5; 29/576 B; 376/183
[58] Field of Search ...................... 376/183; 29/576 B; 148/1.5

[56] References Cited

U.S. PATENT DOCUMENTS 3,897,273  7/1975  Marsh et al. ......................... 148/1.5
3,967,982  7/1976  Arndt et al. ......................... 148/1.5
4,025,365  5/1977  Martin et al. .................... 148/1.5 X

OTHER PUBLICATIONS

"Pulsed Electron-Beam Annealing of Selenium-Implanted Gallium Arsenide," Inada et al., Appl. Phys. Lett. 35 (7), Oct. 1, 1979.
"Planar GaAs IC Technology: Applications for Digital LSI," Eden et al., IEEE Journal of Solid-State Circuits, vol. SC-13, No. 4, Aug. 1978.
Article Entitled: "Doping of Semi-Insulating and N-Type GaAs by Neutron Transmutation," Mueller et al., J. Appl. Phys. 51 (6), Jun. 1980, pp. 3178-3180.

*Primary Examiner*—Brian E. Hearn
*Assistant Examiner*—Alan E. Schiavelli
*Attorney, Agent, or Firm*—Hill, Van Santen, Steadman & Simpson

[57] ABSTRACT

A high resistance semiconductor substrate body with a thin low resistance active semiconductor layer thereon is generated by a method including the steps of subjecting the semiconductor substrate body to neutron bombardment to a degree which produces high resistance in the semiconductor body and whereby doping substances are generated in the substrate body by the thermal neutron bombardment. A thin low resistant active semiconductor layer is then generated on the substrate body by annealing, a surface of the semiconductor substrate body up to a selected depth by laser radiation or electron radiation such that the lattice deterioration which was caused by the neutron bombardment is eliminated but the doping which was generated by the transmutation of elements during neutron bombardment remains. The annealing can be undertaken only in selected regions on the surface of the semiconductor substrate body, thereby facilitating the construction of integrated circuit components thereon.

5 Claims, 3 Drawing Figures

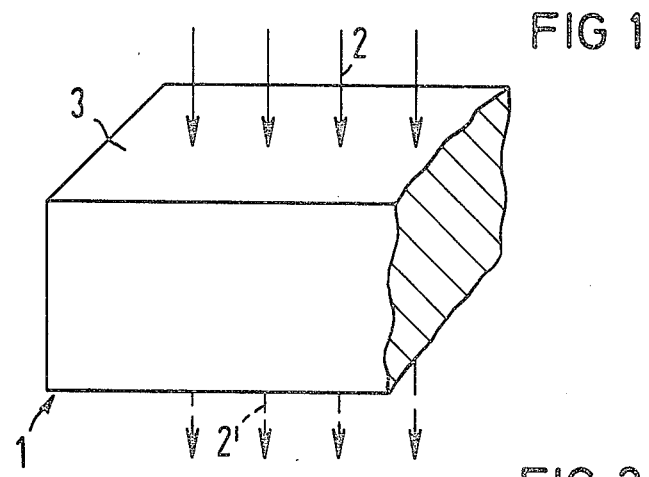
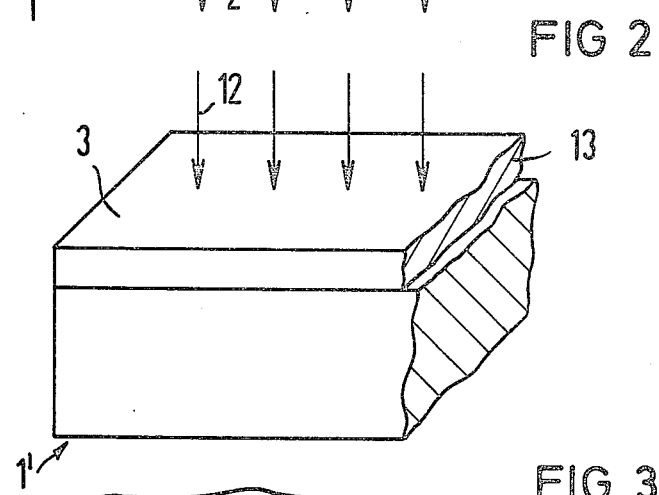
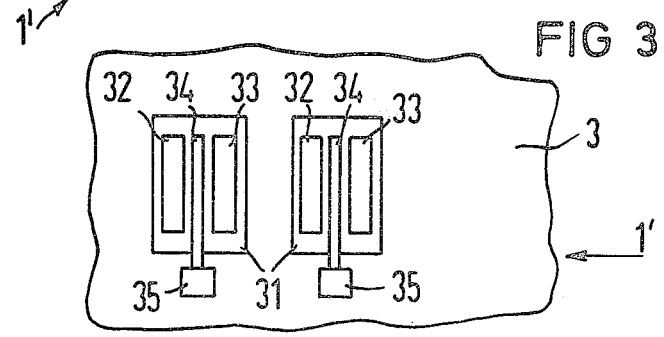

METHOD FOR MAKING HIGH RESISTANCE CHROMIUM-FREE SEMICONDUCTOR SUBSTRATE BODY WITH LOW RESISTANCE ACTIVE SEMICONDUCTOR LAYER BY SURFACE IRRADIATION

BACKGROUND OF THE INVENTION

For the realization of high frequency transistors and diodes as well as fast integrated circuits on substrate bodies consisting of semiconductor material, particularly consisting of III-V semiconductor material such as gallium arsenide, indium phosphide and the like, thin active layers of the semiconductor material are required which are situated on a high resistance substrate material. In conventional devices employing gallium arsenide, a thin active gallium arsenide layer is epitaxially grown on a semi-insulating gallium arsenide substrate body. The semi-insulating property of the gallium arsenide substrate body is achieved by means of chromium doping. Chromium doping can also be employed in substrates having indium phosphide to achieve the semi-insulating property.

A disadvantage inherent in the methods and resulting components described above is that the chromium therein is redistributed during the epitaxial growth step and/or during the thermal annealing process which is necessary to activate the implanted donor atoms. The chromium diffuses into the epitaxial layer as well as diffusing into those areas of maximum lattice deterioration in the implanted region. Moreover, the electrical properties of the active layer such as doping density, doping profile, mobility and the like are subject to undesired influences as a result of the chromium migration. The physical characteristics and operating parameters of components manufactured as described above become undefined as a result of the unpredictable and random effect of the chromium migration and thus result in broad operating tolerances.

A proposal to minimize the disadvantageous effects of the migration of the chromium into the active layer is to generate a so-called buffer layer between the substrate body and the layer which is epitaxially grown. The generation of such a buffer layer, however, involves signficant commercial outlay resulting in a significantly more expensive component.

It is also conceptually possible to prevent the chromium redistribution in the implanted layer by manufacturing the semi-insulating substrate without chromium doping, however, this concept would also involve a significantly increased outlay because great demands would be made of the crystal growth which would require extremely careful control.

SUMMARY OF THE INVENTION

It is an object of the present invention to provide a high resistance semiconductor substrate body with a thin low resistance active semiconductor layer thereon which can be produced with a minimum of manufacturing outlay and which has electrical values for the semiconductor components resulting therefrom which are substantially predictable within specified limits.

The above object is inventively achieved in a method and apparatus in which the substrate body is subjected to thermal neutron bombardment to a degree which generates the high resistance and which generates doping substances in the substrate body. The upper surface, which will form the active semiconductor layer, exhibits the doping profile characteristic for neutron bombardment. The lattice deteriorations existing in the active semiconductor layer due to the thermal neutron bombardment are eliminated in the active semiconductor layer by annealing/utilizing laser radiation or electron radiation. It is known that bombarding a semiconductor substrate body with neutrons will result in the generation of a high resistance semiconductor substrate body in which the crystal lattice of the semiconductor body is disturbed in such a manner so as to result in the high resistance, even though doping substances are simultaneously generated in the semiconductor body by the neutron bombardment. For the purposes of the present invention of generating a semiconductor substrate body which can be used as an electrical component, the initial material for the neutron bombardment is preferably semiconductor material which, for example, is n-doped, such as gallium arsenide. For n-doped gallium arsenide, the doping level $N_D-N_A$ can be less than or equal to $5 \cdot 10^{16} \, cm^{-3}$. This initial material contains no chromium. Wafers of such material are irradiated with thermal neutrons having an energy of, for example, approximately 0.025 eV in such a manner that the transmutation of gallium atoms and arsenic atoms occurs in the entire volume of the substrate, as is an observed phenomenon for such neutron bombardment as is described in the Journal of Applied Physics, Vol. 51 (1980) at pages 3178 through 3180. The target doping can thus lie in the range of approximately $5 \cdot 10^{16}$ through $10^{18} \, cm^{-3}$.

The wafers of semiconductor material bombarded with neutrons in such a manner exhibit a high resistance after the transmutation of elements in their entire volume. It is only at temperatures of approximately 650° C. that the lattice disruptions which are caused in the substrate by the neutrons are annealed and the germanium and selenium atoms which have arisen are thus built into lattice locations. This is utilized in the present invention in that only a thin surface layer of the high resistance semiconductor substrate body produced by the neutron bombardment is subjected to annealing. This is achieved by laser radiation of such a wavelength or electron radiation of such an energy and dose which are selected to as to penetrate into the semiconductor material up to a mean depth which is equal to the desired thickness of the thin low resistance active semiconductor layer. The wavelength dependency of the absorption and the energy and dose dependency of the electron radiation thus play a determining role in determining the penetration depth. The crystal regions in the substrate body which lie deeper than the selected penetration depth remain unaffected by the incident radiation.

The radiation which has penetrated the thin surface layer of the semiconductor substrate body and absorbed thereby results in a correspondingly high heating of this thin portion of the semiconductor material with the result that annealing occurs and a doping of this layer occurs. In the above-described example of gallium arsenide, a low resistance active n-conductive semiconductor layer results on the semiconductor substrate body of gallium arsenide. The substrate body of gallium arsenide retains the high resistance characteristics resulting from the neutron bombardment.

BRIEF DESCRIPTION OF THE DRAWINGS

FIG. 1 is a perspective view of a method for generating a high resistance semiconductor substrate body with a low resistance semiconductor layer in accordance with the principles of the present invention.

FIG. 2 is a further step in the method of FIG. 1 showing a completed article.

FIG. 3 is an example of another embodiment of the process for generating selected types of electrical components.

DESCRIPTION OF THE PREFERRED EMBODIMENTS

A portion of a semiconductor substrate body consisting of, for example, gallium arsenide is shown referenced at 1 in FIG. 1 in perspective view. The substrate body 1 may have a net doping $N_D-N_A$ of less than $5 \cdot 10^{16}$ cm$^{-3}$. The substrate body 1 is irradiated with neutron radiation 2 which strikes an upper surface 3 of the substrate body 1 and passes through the substrate body as indicated by the exiting neutron radiation 2'. In passing through the substrate body 1, the neutron radiation 2 converts gallium atoms into germanium atoms and arsenic atoms into selenium atoms. The neutron radiation 2 also produces such lattice disruptions in the semiconductor material of the substrate body 1 which result in a high specific resistance in the substrate body 1.

FIG. 2 shows the same portion of the substrate body 1 which was shown in FIG. 1, however because the material has now been converted into high resistance material it is referenced with 1' in FIG. 2. The substrate body 1' is subjected to a further curing step which eliminates the lattice disruptions in a thin upper portion of the substrate body, resulting in a low resistance layer 13. The radiation which effects the curing is indicated at 12, which can be either laser radiation or electron radiation. The radiation 12 strikes the surface 3 of the substrate body 1'. If laser radiation is employed the wavelength of the laser radiation is selected so that the laser radiation penetrates only to a selected depth in the substrate body 1', shown in great exaggeration in FIG. 2. If electron radiation is employed, the same result is achieved by selecting the energy and dose of the electron radiation to result in a desired penetration depth.

The effect of the laser or electron radiation 12 is that as a result of the absorbed radiation energy the thin layer 13 is considerably heated. Within this heated zone the curing of the lattice disruption which was caused by the neutron bombardment occurs. In the example of a gallium arsenide substrate, the germanium and arsenic doping remains which effects an n-doping of the material in the layer 13 which has now become low resistant due to the curing step. The laser or electron irradiation of the surface of substrate body 1' can be undertaken over the entire surface, however, is preferably executed in such a manner that the surface 3 is scanned with the laser or electron beam. The radiation 12 may also have an oblique angle of incidence to the surface 3 for certain applications.

The above method results in an article which has a thin low resistance active semiconductor layer on a high resistance substrate body. Moreover, the low resistance active semiconductor layer can be generated regionally such that only selected areas of the surface 3 which are subjected to the radiation 12 are transformed into the low resistant active layer while the remaining non-irradiated portions of the surface 3 remain in the high resistance state which was produced by the neutron bombardment 2. An example of such selected curing is shown in plan view in FIG. 3 wherein the substrate body has been subjected to the thermal neutron bombardment and is now a high resistance body 1'. The annealing step is only undertaken in regions such as those referenced at 31 by directing the laser or electron radiation only at those designated surface regions. Thus, only the regions 31 exhibit the low resistance characteristics up to the slight depth in accordance with the method described above and the remaining unannealed surface portions of the substrate body 1' remain high resistant as was effected by the neutron bombardment. Electronic components such as, for example, field effect transistors can be generated with source and drain terminals 32 and 33 as well as with gate electrodes 34 within the regions 31. The relatively narrow gate electrodes 34, for example, may have connection paths 35 with a relatively larger area, whereby the connection paths 35 are disposed, for example, beyond the low resistant regions 31 on the remaining high resistant portions of the substrate body 1'. The exemplary illustration of FIG. 3 serves only to show one type of component which can be generated by controlling the radiation 12 by limiting the radiation to selected regions. It will be apparent that other types of electronic components can be generated with different control parameters.

The annealing radiation 12 can be controlled so as to limit the annealing to the regions shown in FIG. 3 or other selected regions by undertaking a line-wise scanning of the surface 3 of the substrate body 1' with the radiation 12 and by employing a gating means to energize the radiation source only when the radiation is directed to irradiate one of the prescribed regions, such as region 31.

Although modifications and changes may be suggested by those skilled in the art it is the intention of the inventor to embody within the patent warranted hereon all changes and modifications as reasonably and properly come within the scope of his contribution to the art.

I claim as my invention:

1. A method for producing a high-resistant substrate body with a low-resistant active semiconductor layer consisting of the same semiconductor material as said substrate body comprising the steps of:
    bombarding a gallium arsenide substrate body with thermal neutrons until said substrate body achieves high resistance;
    irradiating a surface of said substrate with laser or electron radiation for annealing said substrate, said substrate having doping atoms generated by means of neutron transmutation as a result of said bombarding and irradiating for generating said low resistant active semiconductor layer at said surface having a predetermined depth; and
    maintaining said substrate body free of chromium atoms at all times.

2. The method of claim 1 wherein said step of irradiating said surface of said semiconductor substrate body with laser radiation is further defined by selecting laser radiation having a wave length such that a predetermined radiation penetration depth is achieved.

3. The method of claim 1 wherein the step of irradiating said surface of said substrate body with electron radiation is further defined by selecting electron radiation having an energy and a dose such that a thin predetermined penetration depth of said radiation is achieved.

4. A method for producing a high-resistant substrate body with a low-resistant layer as claimed in claim 1 wherein the step of irradiating said surface of said substrate body with electron or laser radiation is further defined by laterally restricting the areas of said substrate surface irradiated by said radiation such that said substrate body remains high-resistant outside of said areas.

5. A method for producing a high-resistant substrate body with a low-resistant layer as claimed in claim 4 comprising the additional step of disposing terminal pads for a semiconductor component on said portions of said substrate body which remain high resistant.

* * * * *